United States Patent
Jordanger

(10) Patent No.: US 10,756,725 B2
(45) Date of Patent: Aug. 25, 2020

(54) LOAD SWITCH HAVING A CONTROLLED SLEW RATE

(71) Applicant: Texas Instruments Incorporated, Dallas, TX (US)

(72) Inventor: Ricky Dale Jordanger, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/190,493

(22) Filed: Nov. 14, 2018

(65) Prior Publication Data

US 2019/0393870 A1 Dec. 26, 2019

Related U.S. Application Data

(60) Provisional application No. 62/688,131, filed on Jun. 21, 2018, provisional application No. 62/688,735, filed on Jun. 22, 2018.

(51) Int. Cl.
*H02H 9/00* (2006.01)
*H03K 17/16* (2006.01)
*H03K 5/04* (2006.01)

(52) U.S. Cl.
CPC .......... *H03K 17/166* (2013.01); *H02H 9/001* (2013.01); *H03K 5/04* (2013.01)

(58) Field of Classification Search
CPC ......... H02H 9/001; H03K 5/04; H03K 17/166
USPC ....... 327/108, 109, 111, 365, 378, 392, 398, 327/399, 419, 427, 434
See application file for complete search history.

(56) References Cited

U.S. PATENT DOCUMENTS

| 9,729,059 | B1* | 8/2017 | Parto | H02M 3/00 |
| 9,929,652 | B1* | 3/2018 | Ribarich | H02M 1/08 |
| 2007/0296386 | A1* | 12/2007 | Umeki | H02M 1/36 323/284 |
| 2009/0180570 | A1* | 7/2009 | Koh | G05F 1/56 375/295 |
| 2010/0026250 | A1* | 2/2010 | Petty | H02M 3/156 323/271 |
| 2014/0043077 | A1 | 2/2014 | Brauer | |
| 2016/0252925 | A1 | 9/2016 | Kondo | |
| 2017/0019095 | A1* | 1/2017 | Leong | H03K 17/167 |
| 2019/0214973 | A1* | 7/2019 | Choi | H02M 1/08 |

FOREIGN PATENT DOCUMENTS

SU 903838 A 2/1982
WO 2013131596 A1 9/2013

* cited by examiner

*Primary Examiner* — William Hernandez
(74) *Attorney, Agent, or Firm* — Lawrence J. Bassuk; Charles A. Brill; Frank D. Cimino

(57) ABSTRACT

A load switch circuit implemented on an IC chip includes a first node for coupling to an input voltage, a second node for coupling to an external load, first and second capacitor nodes for coupling to first and second terminals of an external capacitor, and a first PFET coupled between the first node and the second node to control an output voltage to the external load. The load switch circuit also includes a driver circuit having a first NFET that has a drain coupled to the first node and a source coupled to a gate of the first PFET. A slew-rate-control circuit is coupled to a gate of the first NFET and includes the first capacitor node, which is coupled to the gate of the first NFET, and the second capacitor node, which is coupled to the second node.

18 Claims, 10 Drawing Sheets

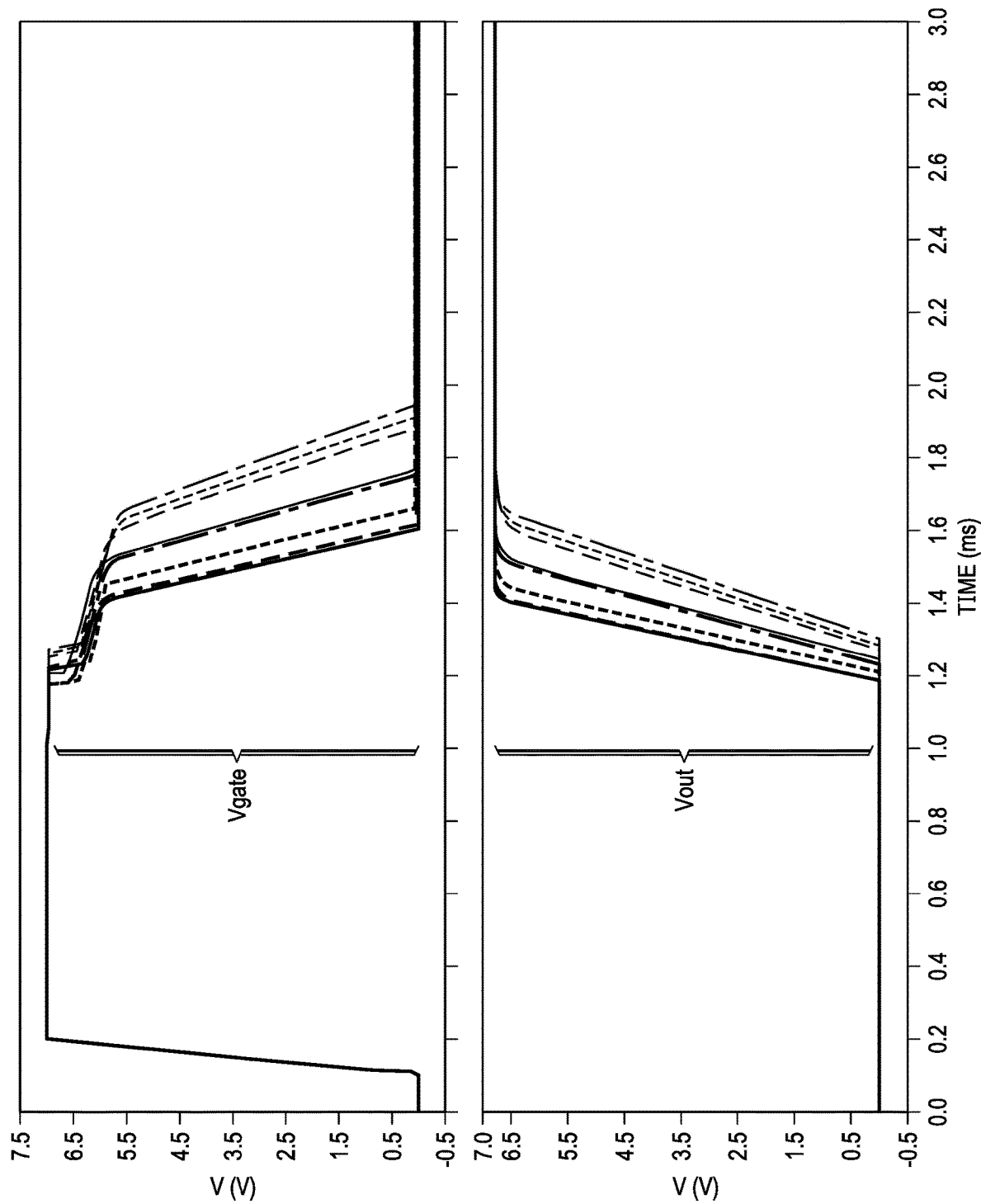

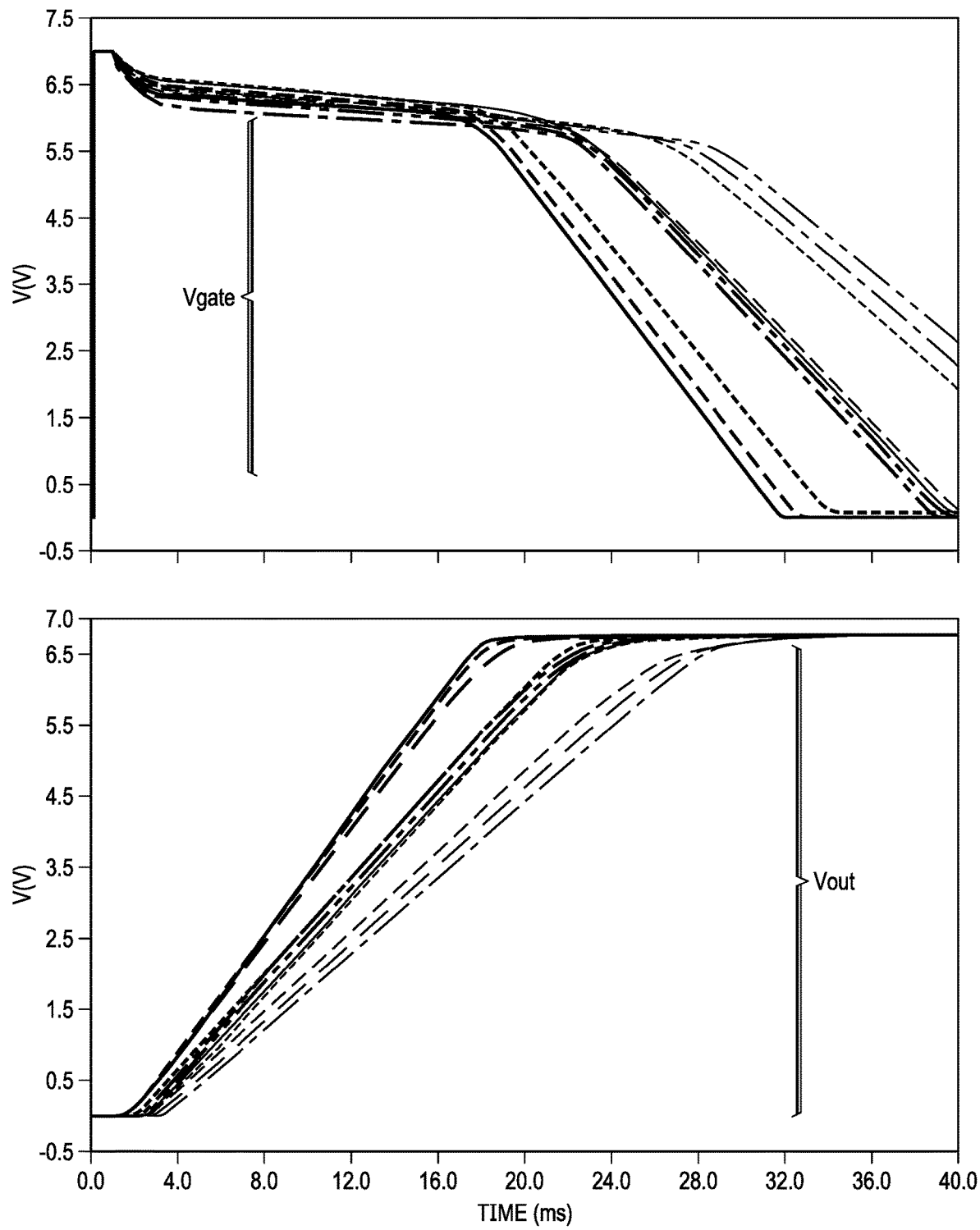

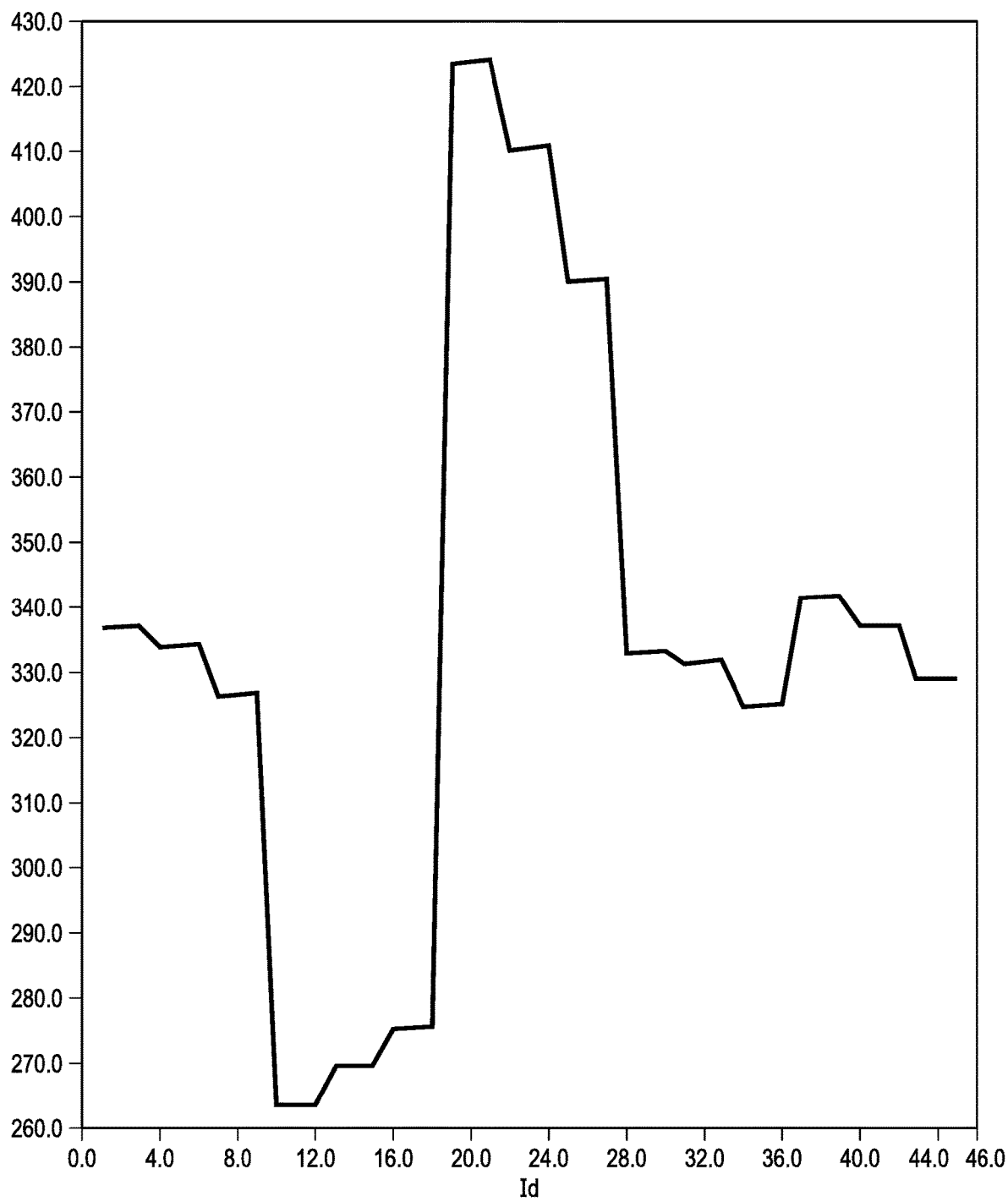

LOAD SWITCH HAVING A CONTROLLED SLEW RATE

PRIORITY UNDER 35 U.S.C. § 119(e) & 37 C.F.R. § 1.78

This non-provisional application claims priority based upon the following prior United States provisional patent application(s): (i) "SLEW RATE CONTROLLED DRIVER," Application No.: 62/688,735, filed Jun. 22, 2018, in the name(s) of Ricky Dale Jordanger, and (ii) "DRIVER SOFT-START RECOVERY CIRCUIT," Application No.: 62/688,131, filed Jun. 21, 2018, in the name(s) of Ricky Dale Jordanger and Hector Torres, each of which is hereby incorporated by reference in its entirety.

FIELD OF THE DISCLOSURE

Disclosed embodiments relate generally to the field of circuits for power management systems. More particularly, and not by way of any limitation, the present disclosure is directed to a load switch having a controlled slew rate.

BACKGROUND

Load switches for power management systems require fixed or adjustable soft-start whenever the switch is enabled. Soft-starts avoid large in-rush currents into the load, which could potentially pull down the input power supply below recommended operating conditions. While most commercial load switches utilize N-type pass gates, load switches using P-type pass gates have advantages for radiation environments such as space. These load switches need a well-controlled soft-start and a driver that is easy to program for slew-rate limiting to implement the soft-start.

SUMMARY

Disclosed embodiments provide a load switch circuit that has a P-type pass element and a well-controlled slew rate. A driver circuit for the P-type pass element includes a unity gain buffer coupled to the gate of the P-type pass element. A slew-rate-control circuit includes two nodes for coupling to a slew-rate capacitor, which is typically external. A first node of the circuit couples a first terminal of the slew-rate capacitor to the non-inverting input of the unity gain buffer; a second node couples the second terminal of the slew-rate-control capacitor to the output node for the load switch. Placing the unity gain buffer between the slew-rate capacitor and the gate of the P-type pass element allows for much smaller values of the slew-rate capacitor to achieve a given slew rate, while connecting the slew-rate capacitor to the output node instead of to either the upper rail (e.g., Vin) or the lower rail (e.g., ground) leads to much better control of the slew rate. Additionally, because the slew-rate capacitor is configured in feedback, the slew rate becomes insensitive to the output capacitance. In one embodiment, a source follower N-type transistor provides the unity gain buffer.

In one aspect, an embodiment of a load switch circuit implemented on an integrated circuit chip is disclosed. The load switch circuit includes a first node for coupling to an input voltage; a second node for coupling to an external load; a first capacitor node for coupling to a first terminal of an external capacitor; a second capacitor node for coupling to a second terminal of the external capacitor; a first P-type field effect transistor (PFET) coupled between the first node and the second node to control an output voltage to the external load; a driver circuit comprising a first N-type field effect transistor (NFET) having a drain coupled to the first node and a source coupled to a gate of the first PFET; and a slew-rate-control circuit coupled to a gate of the first NFET, the slew-rate-control circuit comprising the first capacitor node, which is coupled to the gate of the first NFET, and the second capacitor node, which is coupled to the second node.

In another aspect, an embodiment of a load switch circuit implemented on an integrated circuit chip is disclosed. The load switch circuit includes a first node for coupling to an input voltage; a second node for coupling to an external load; a third node for coupling to a ground plane; a first capacitor node for coupling to a first terminal of an external capacitor; a second capacitor node for coupling to a second terminal of the external capacitor; a first PFET coupled between the first node and the second node to control an output voltage to the external load; a driver circuit comprising a unity gain buffer coupled between the first node and the third node, an output of the unity gain buffer being coupled to a gate of the first PFET; and a slew-rate-control circuit coupled to a non-inverting input of the unity gain buffer, the slew-rate-control circuit comprising the first capacitor node, which is coupled to the non-inverting input to the unity gain buffer, and the second capacitor node, which is coupled to the second node.

In yet another aspect, a method of operating a load switch circuit is disclosed. The method includes providing a load switch circuit implemented on an integrated circuit (IC) chip, the load switch circuit comprising a P-type pass element; coupling a first terminal of an external capacitor to a first capacitor pin of the IC chip, the first capacitor pin coupling the external capacitor to a non-inverting input of a unity gain buffer that controls a gate of the P-type pass element; and coupling a second terminal of the external capacitor to a second capacitor pin of the IC chip, the second capacitor pin coupling the external capacitor to an output node of the IC chip.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

FIG. 3A depicts a gate voltage and an output voltage for a number of runs made using a P-type load switch circuit according to an embodiment of the disclosure;

FIG. 5A depicts a gate voltage and an output voltage for a number of a number of runs made using a P-type load switch according to an embodiment of the disclosure in which three different settings are shown for the output capacitance;

FIG. 5B depicts a graph that charts the slew rate across the various runs for a P-type load switch according to an embodiment of the disclosure in which three different settings are shown for the output capacitance;

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

For the purposes of this patent application, reference to an upper rail and a lower rail are intended to reference the upper and lower power supply lines. In general, the upper rail refers to the input voltage Vin and the lower rail refers to a local ground, which may or may not be the same as ground. Likewise, reference to a low or high value for the voltage on a signal refers to a value that is interpreted as either zero or one, i.e., a binary value. Two signals may have the same binary value of zero or one, but not share the exact same voltage.

Figure 8:
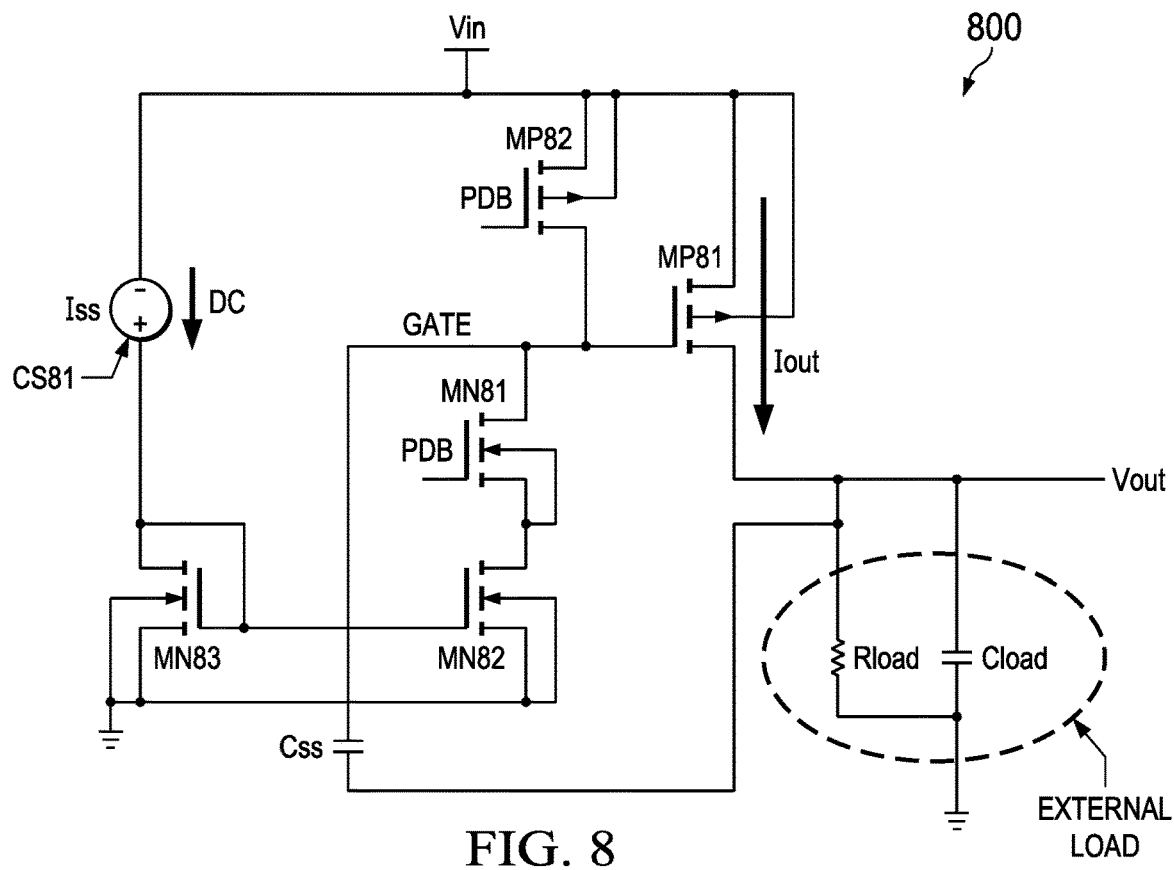
FIG. 8 depicts a P-type load switch according to the prior art.

FIG. 8 depicts a load switch circuit 800 having a power PFET MP81 as a pass element according to the prior art. Load switch circuit 800 is a current mode gate driver with a soft-start capacitor Css connected in a Miller configuration. Power PFET MP81 is coupled between the upper rail Vin and an output node Vout and controls the current provided to an external load that is represented by load resistance Rload and load capacitance Cload. A PFET MP82 is coupled between the upper rail Vin and the gate of power PFET MP81; the gate of PFET MP82 receives a power down bar (PDB) signal, which has a low value when the circuit is powered on. A slew-rate-control circuit to provide a controlled turn-on of power PFET MP81 includes current sink CS81, three NFETs MN81, MN82 and MN83, and a connection to couple the GATE node to a soft-start capacitor Css, which is generally external. Current sink CS81 and NFET MN83 are coupled in series between the upper rail Vin and the lower rail, e.g., the ground plane of the circuit, with NFET MN83 being diode-coupled. NFET MN81 and NFET MN82 are coupled in series between the gate of power PFET MP81 and the lower rail; the gate of NFET MN81 is coupled to receive signal PDB while the gate of NFET MN82 is coupled to the gate of NFET MN83 to form a current mirror.

When load switch circuit 800 is powered on, signal PDB is low, which turns on PFET MP82 and pulls the GATE node high; a high value on the GATE node ensures that the pass element, power PFET MP81 is off. At the same time, current source CS81 provides a current DC to the drain and gate of NFET MN83 to turn on both of NFETS MN82, MN83. However, while NFET MN82 attempts to match the current flowing through NFET MN83, signal PDB is low, which keeps NFET MN81 off. With the GATE node being pulled high, the terminal of soft-start capacitor Css that is coupled to the GATE node is charged. When signal PDB is switched high, PFET MP82 is turned off and NFET MN81 is turned on, so that a constant current is drained from the GATE node, allowing power PFET MP81 to turn on. At the same time, soft-start capacitor Css will release the charge to the GATE node, slowing the rate of turn-on of power PFET MP81. In devices where a large dynamic range for the output slew rate is required, a large current is necessary to drive the gate of the output PFET. For a large drive current, a large soft-start capacitor Css is also required.

Figure 1:
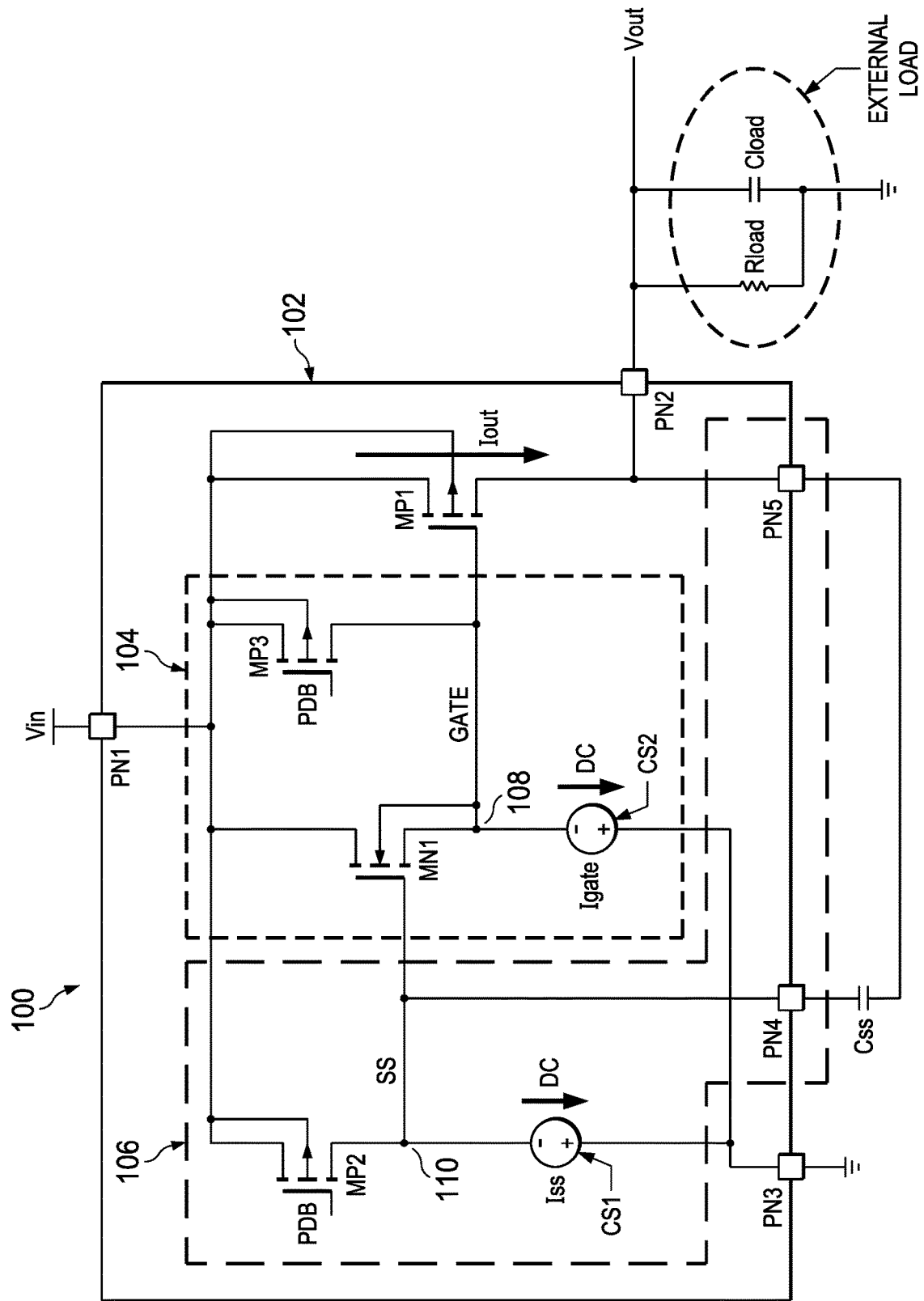
FIG. 1 depicts a P-type load switch circuit according to an embodiment of the disclosure.

FIG. 1 depicts an example load switch circuit 100 implemented on an integrated circuit (IC) chip 102. Load switch circuit 100 is shown as a stand-alone IC chip 102, but can also be implemented as part of a larger chip that includes additional circuits. A majority of commercial load switches use an NFET for the pass element; however, the embodiment of FIG. 1 was designed for use in space and utilizes a first PFET MP1 for improved performance in a radiation environment. As shown in this figure, IC chip 102 includes five nodes that can be coupled to external circuits or voltage sources; in one embodiment, these nodes are coupled to pins during packaging. A first node PN1 is for coupling to an input voltage Vin to provide an upper rail for load switch circuit 100. Second node PN2 is for coupling to an external load, represented in this figure as load capacitance Cload and load resistance Rload, and provides the output voltage Vout. A third node PN3 is for coupling to a ground plane and provides the lower rail for load switch circuit 100. A fourth node PN4, which can also be referred to as a first capacitor node, is for coupling to a first terminal of an external soft-start capacitor Css that is used to store the energy that helps control the slew rate of the pass element. A fifth node PN5 or second capacitor node is for coupling to the second terminal of the external soft-start capacitor Css.

As shown in FIG. 1, load switch circuit 100 includes a driver circuit 104 and a slew-rate-control circuit 106. Other circuits (not specifically shown) can include control logic for the driver circuit 104 and optionally, a quick output discharge circuit, a thermal shutdown circuit, a reverse current protection circuit and a current limiting circuit. First PFET MP1 is a power PFET and is coupled between the first node and the second node, with a source coupled to receive input voltage Vin, a drain coupled to provide the output voltage Vout, and a gate that is also referred to as the GATE node.

Slew-rate-control circuit 106 includes second PFET MP2, first current sink CS1 and both fourth node PN4 and fifth node PN5. Fourth node PN4 is coupled to the node SS, which provides the input for driver circuit 104. Second PFET MP2, which receives a power-down-bar (PDB) signal on the gate, is coupled in series with first current sink CS1 between the first node and the third node, with node SS being coupled to a node 110 between the drain of second PFET MP2 and first current sink CS1.

Driver circuit 104 includes a first NFET MN1, a third PFET MP3 and a second current sink CS2. Third PFET MP3 is coupled between the first node and the gate for the pass element, first PFET MP1; the gate of third PFET MP3 receives the signal PDB. First NFET MN1 is coupled in series with second current sink CS2 between the first node and the third node, with the gate of first PFET MP1 being coupled to a node 108 that lies between the source of first NFET MN1 and second current sink CS2. The gate of first NFET MN1 is labeled SS and the slew-rate-control circuit 106 that is coupled to node SS provides a soft-start ramp when first PFET MP1 is turned on.

The operation of load switch circuit 100 is as follows. When the system is powered on, the signal PDB is low; second and third PFET transistors MP2, MP3 are turned on, pulling both the SS node and the GATE node to the input voltage Vin so that external soft-start capacitor Css is charged, first NFET MN1 is turned on, first PFET MP1 is turned off and no current flows through the load switch. To achieve this end, second PFET MP2 is designed to provide a larger current than is passed by first current sink CS1; similarly, third PFET MP3 is designed to provide a larger current than is passed by second current sink CS2. When the load switch is to be enabled, the signal PDB goes high; second PFET MP2 and third PFET MP3 turn off, so that first and second current sinks CS1 and CS2 pull down respectively on the SS node and the GATE node. The first current Iss through first current sink CS1 discharges the SS node and external soft-start capacitor Css at a steady rate to slowly turn off first NFET MN1. First NFET MN1 is a source follower transistor implemented as a low threshold voltage (Vt) transistor and causes the value on the GATE node to follow the value on the SS node. First current Iss passed by first current sink CS1 sets the turn on slew rate of first PFET MP1. Second current Igate is the pull-down current for the GATE. Since the output switch is P-type, the circuit does not require a negative charge pump to pass a positive voltage; however, a negative charge pump can be added if a lower on-resistance, RDSON, is required. In general, the ratio between the first current Iss and the second current Igate is between 1:10 and 1:1,000; a typical value of the ratio is from 1:20 to 1:100.

The use of the source-follower, first NFET MN1, as a buffer between the SS node and the GATE node allows the use of a much smaller value of external soft-start capacitor Css to achieve a given slew rate. Additionally, connecting external soft-start capacitor Css between the SS node and the output node, rather than between the SS node and a local ground, leads to a much better controlled slew rate as will be demonstrated with regard to FIGS. 3A, 3B, 4A, 4B. Because the external soft-start capacitor Css is configured in feedback, the slew rate becomes insensitive to the output capacitance Cout as demonstrated by FIGS. 5A, 5B. The governing equations and the derivation thereof are disclosed below.

Figure 2:
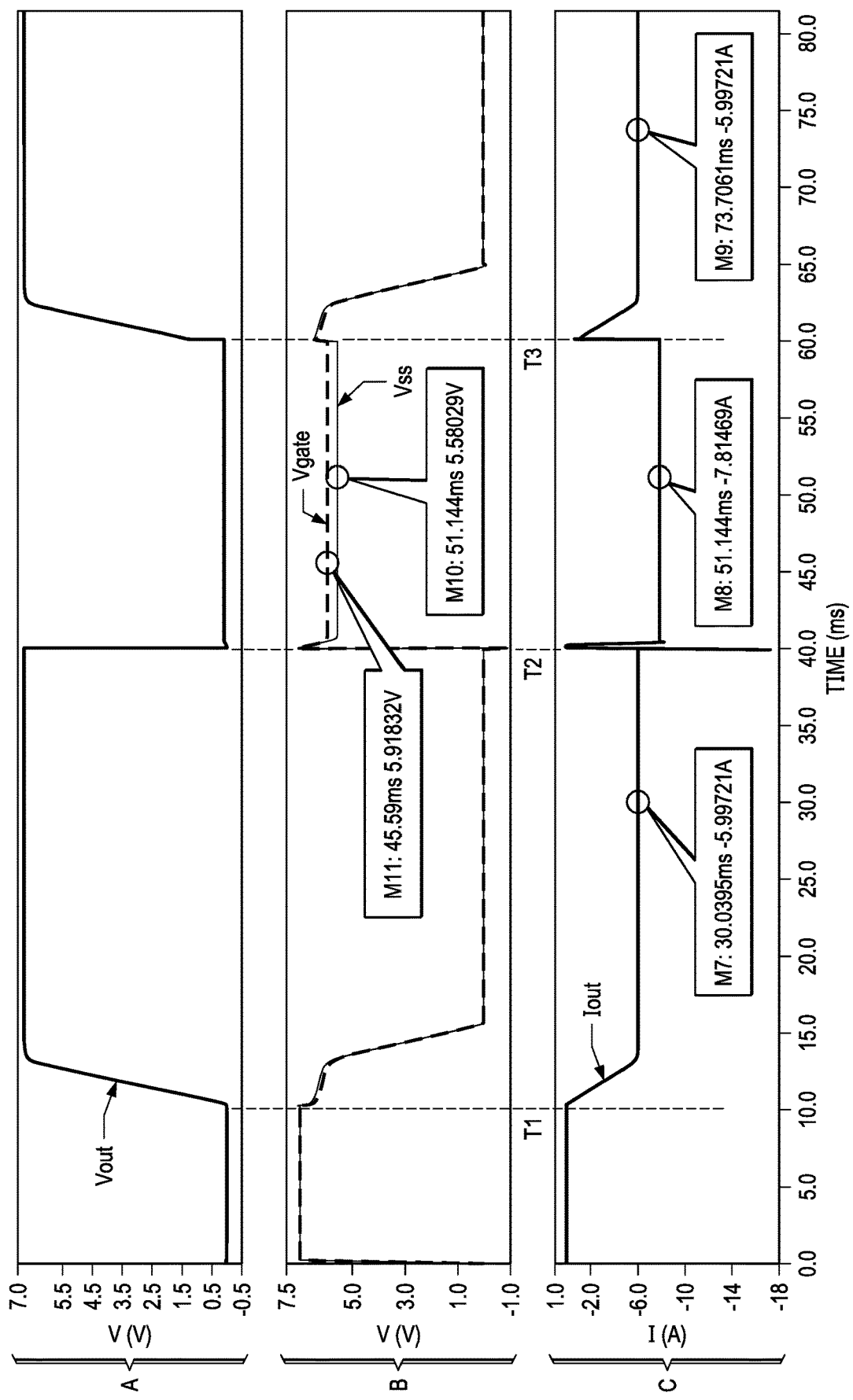
FIG. 2 depicts a number of signals from the load switch circuit of FIG. 1 during and after startup and a short according to an embodiment of the disclosure.

FIG. 2 contains Graphs A, B and C that each depict signals associated with a driver circuit for a load switch containing the disclosed slew-rate-controlled driver; the signals are shown during power on and enablement of the circuit with a 6 Amp load, followed by a 10 milliohm short with a 7.5 Amp current limit setting. Graph A depicts the output voltage Vout; Graph B depicts both the voltage Vss on the SS node and the voltage Vgate on the GATE node, which have nearly identical values in segments of the graph; and Graph C depicts the output current Iout. As the graphs begin, the circuit is powered on, with signal PDB low. With signal PDB low, both of second and third PFETs MP2 and MP3 are turned on, which pulls up both the SS node and the GATE node. Voltages Vgate and Vss rise to a high binary value, which keeps first PFET MP1 off and charges soft-start capacitor Css. At time T1, signal PDB goes high and the values of voltages Vss and Vgate begin to drop, although the drop is initially slowed as soft-start capacitor Css releases the voltage stored thereon, providing a ramping voltage on output voltage Vout and a corresponding ramp in the output current Iout.

After the current has stabilized, a short occurs at time T2. Since the circuit has an over current limit set by the user, an over current circuit that is not part of this disclosure immediately pulls up on the GATE node to turn off the switch, but then allows a current up to the current limit to flow as output current Iout, so that service is not disrupted but no damage is caused downstream to the load. When the short is detected, a soft-start reset circuit (not specifically shown) is turned on and pulls up voltage Vss on node SS to a high value close to that of voltage Vgate, which charges soft-start capacitor Css during the short. When the short is resolved at time T3, the discharge of soft-start capacitor Css slows the drop of voltage Vss on the SS node and therefore the drop of voltage Vgate on the GATE node. As a result, output voltage Vout exhibits the desired ramp-up.

Figure 3B:
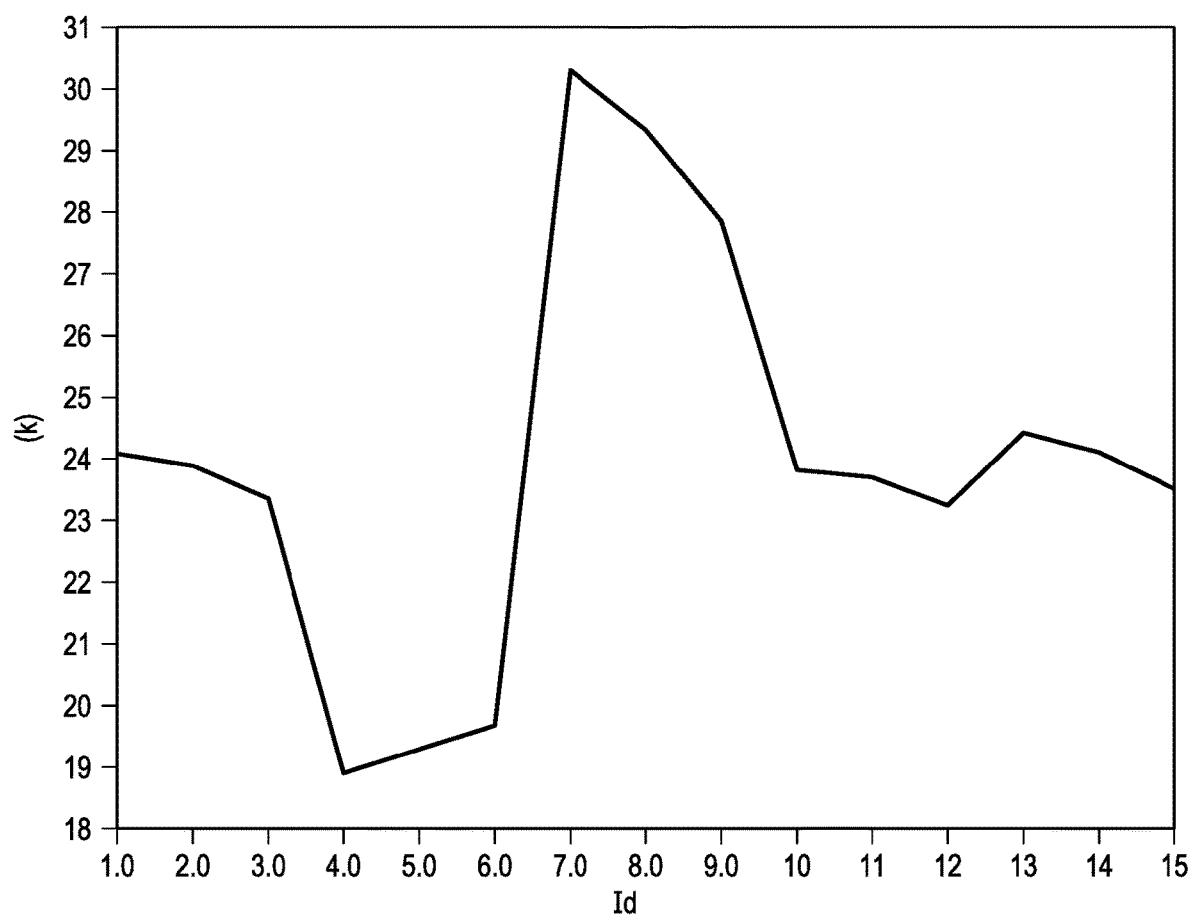
FIG. 3B depicts a graph that charts the slew rate across the various runs for the P-type load switch according to an embodiment of the disclosure.

FIG. 3A depicts a depicts a gate voltage Vgate and an output voltage Vout for a number of runs made using a P-type load switch according to an embodiment of the disclosure for a Vout of 7V and a soft-start capacitor Css having a capacitance of 2.7 nF. Each run represents one of five standard process corners and one of three temperatures, i.e., −55° C., 27° C., and 130° C. It can be seen that each graph of voltage Vgate exhibits a Miller plateau and each graph of output voltage Vout exhibits a smooth transition. FIG. 3B provides a plot that graphs the slew rates that were extracted from the graphs of FIG. 3A for each respective run. FIG. 3B depicts the slew rate on the Y-axis and the run number on the X-axis and demonstrates a variability among the runs of 25%.

Figure 4A:
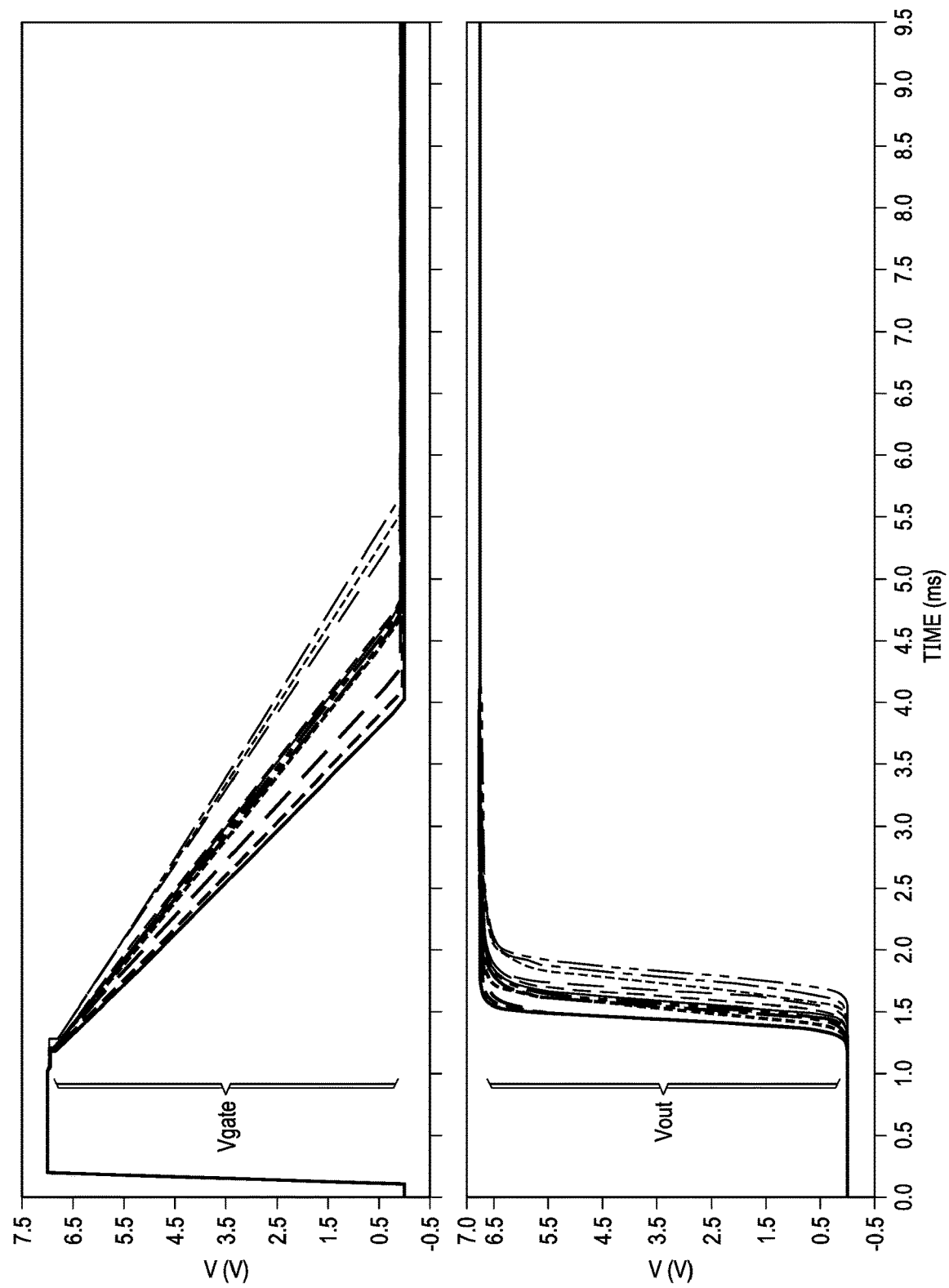
FIG. 4A depicts a gate voltage and an output voltage for a number of runs made using a P-type load switch circuit in which a second terminal of the slew-rate capacitor is coupled to ground.
Figure 4B:
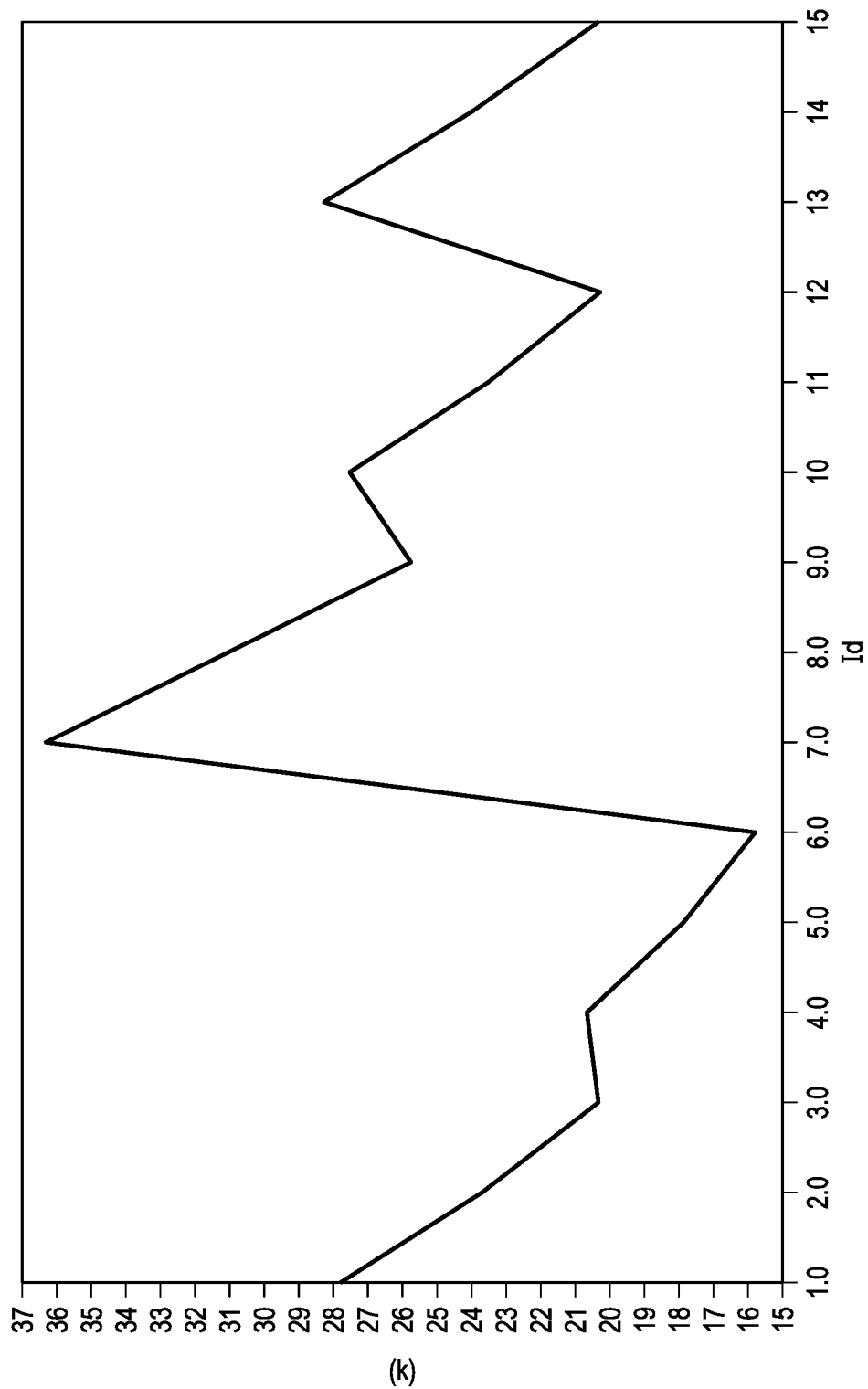
FIG. 4B depicts a graph that charts the slew rate across the various runs for the P-type load switch in which the second terminal of the slew-rate capacitor is coupled to ground.

In comparison, FIG. 4A depicts gate voltage Vgate and output voltage Vout for a number of runs made using a P-type load switch in which the second terminal of soft-start capacitor Css is coupled to the lower rail for a Vout of 7V. A soft-start capacitor Css having a capacitance of 35 nF was utilized. Each run again represents one of the same five standard process corners and one of the same three temperatures. It can be seen that the graphs of voltage Vgate do not exhibit a Miller plateau and the graphs of output voltage Vout exhibit steeper slopes than in FIG. 3A. FIG. 4B graphs the slew rate extracted from the graphs of FIG. 4A for each respective run and shows a variability among the runs of 38%. A comparison of the graphs of FIGS. 3B and 4B demonstrates the tighter controls of the slew rate provided by the present disclosure.

FIG. 5A depicts a depicts gate voltage Vgate and output voltage Vout for a number of runs made using a P-type load switch according to an embodiment of the disclosure for a Vout of 7V and a soft-start capacitor Css having a capacitance of 193 nF. Each run represents one of five standard process corners and one of the three temperatures −55° C., 27° C., and 130° C. and an output capacitance Cout of one of 10 uF, 100 uF and 660 uF. FIG. 5B provides a plot that graphs the slew rate of each run on the Y-axis and the run number on the X-axis and demonstrates a variability of 23%, demonstrating that the slew rate is not affected by changes in the output capacitance.

Figure 6:
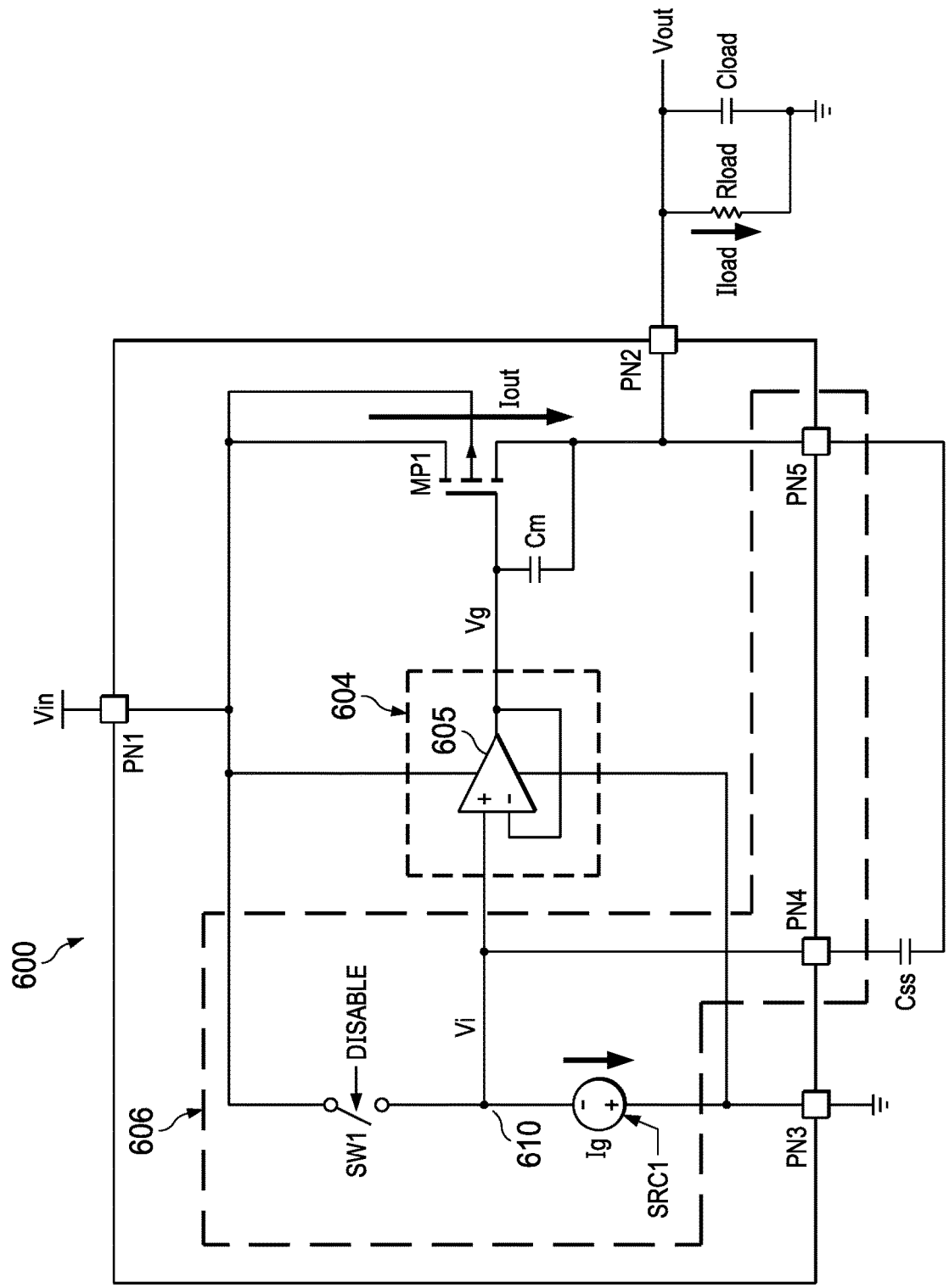
FIG. 6 depicts a generalized version of the load switch of FIG. 1 according to an embodiment of the disclosure.

FIG. 6 depicts a generalized load switch circuit 600, which is an equivalent circuit to load switch circuit 100. First PFET MP1 has a source coupled to upper rail Vin and a drain coupled to output voltage Vout. Driver circuit 604 comprises a unity gain buffer 605 that is coupled between the upper rail formed by input voltage Vin and the lower rail. Unity gain buffer 605 is coupled to provide gate voltage Vg to the gate of first PFET MP1 and to the inverting terminal of unity gain buffer 605. Slew-rate-control circuit 606 provides intake voltage Vi to the non-inverting input of unity gain buffer 605. Slew-rate-control circuit 606 includes disable switch SW1, a slew-rate-control element SRC1 and the two capacitor pins PN4, PN5. Disable switch SW1 and slew-rate-control element SRC1 are coupled in series between the upper rail and the lower rail, with a node 610 between disable switch SW1 and slew-rate-control element SRC1 being coupled to provide intake voltage Vi. In one embodiment, slew-rate-control element SRC1 is a current sink as shown; in one embodiment, slew-rate-control element SRC1 is a resistor (not specifically shown). Slew-rate-control element SRC1 passes a current Ig. Disable switch SW1 is controlled by a disable signal and turns off first PFET MP1 when disable switch SW1 is closed.

The following discussion addresses the advantage of coupling external soft-start capacitor Css to the output node rather than to the lower rail in the disclosed circuit. The gate voltage Vg of first PFET MP1 is inversely related to the output voltage Vout on the drain of first PFET MP1, i.e., as the gate voltage Vg increases, the drain or output voltage Vout decreases. This relationship results in an effect known as the Miller capacitance effect, in which an apparent input capacitance of first PFET MP1 is increased due to amplification of the effect of capacitance between the input and output terminals.

The Miller capacitance is shown in FIG. 6 as capacitance Cm, an amplified value of the gate/drain capacitance Cgd. The increased input capacitance due to the Miller effect is given by the equation:

$$Cm = C(1+|Av|) \quad \text{Equation 1}$$

where Av is the gain of the circuit and is equal to the gain of first PFET MP1 times the load resistance Rload and C is the feedback capacitance, i.e. Css. In the disclosed circuit, the gain of the circuit is usually so much larger than one that the one can be dropped out of the equation to simplify the equation to $$Cm = Css \cdot |Av| \quad \text{Equation 2}$$

The pull down current Ig can be denoted as the product of the capacitance of soft-start capacitor Css times the change in voltage across the gate/drain interface over time, i.e., by the following equation:

$$Ig = Css \frac{dVdg}{dt} = Css \cdot \frac{d(Vout - Vi)}{dt} \quad \text{Equation 3}$$

where intake voltage Vi replaces gate voltage Vg in the latter portion of the equation because Vi=Vg due to the design using unity gain amplifier 605. This equation can be further refined as:

$$Ig = \frac{Css \cdot dVout}{dt} - \frac{Css \cdot dVi}{dt} \quad \text{Equation 4}$$

Pull down current Ig is related to the capacitance of the parasitic capacitor Cm by the following equation:

$$Ig = Cm \frac{dVi}{dt} \quad \text{Equation 5}$$

which, when each side is divided by Cm becomes:

$$\frac{dVi}{dt} = \frac{Ig}{Cm} \quad \text{Equation 6}$$

By dividing each side of Equation 4 by the value Css and using Equation 6 to substitute the right-most element of Equation 4, the equation can be written as:

$$\frac{dVout}{dt} = \frac{Ig}{Css} + \frac{Ig}{Cm} \quad \text{Equation 7}$$

Equation 7 defines the slew rate for the circuit of FIG. 6. Further, where the parasitic capacitance Cm is much greater than the slew-rate capacitance Css, the slew rate can be simplified to $$\frac{dVout}{dt} = \frac{Ig}{Css} \text{ for } Cm \gg Css \quad \text{Equation 8}$$

By taking the integral of both sides of Equation 7, the equation becomes:

$$\int dVout = \int \frac{Ig}{Css} dt + \int \frac{Ig}{Cm} dt \quad \text{Equation 9}$$

which can then be simplified as:

$$Vout = \left(\frac{Ig}{Css} + \frac{Ig}{Cm}\right) \cdot t \quad \text{Equation 10}$$

where t is time. Once we know the output voltage Vout, the output current Iout can be calculated using the equation:

$$Iout = \frac{Vout}{Zout} \quad \text{Equation 11}$$

where Zout is the output impedance. The current through the load Iload can be determined by the following equation:

$$Iload = \frac{Vout}{Rload} \quad \text{Equation 12}$$

Output current Iout varies with load resistance Rload and with 1/Cout*s, so the slew rate dVout/dt is much more tightly controlled by the closed loop feedback system provided by the disclosed circuit.

Figure 7:
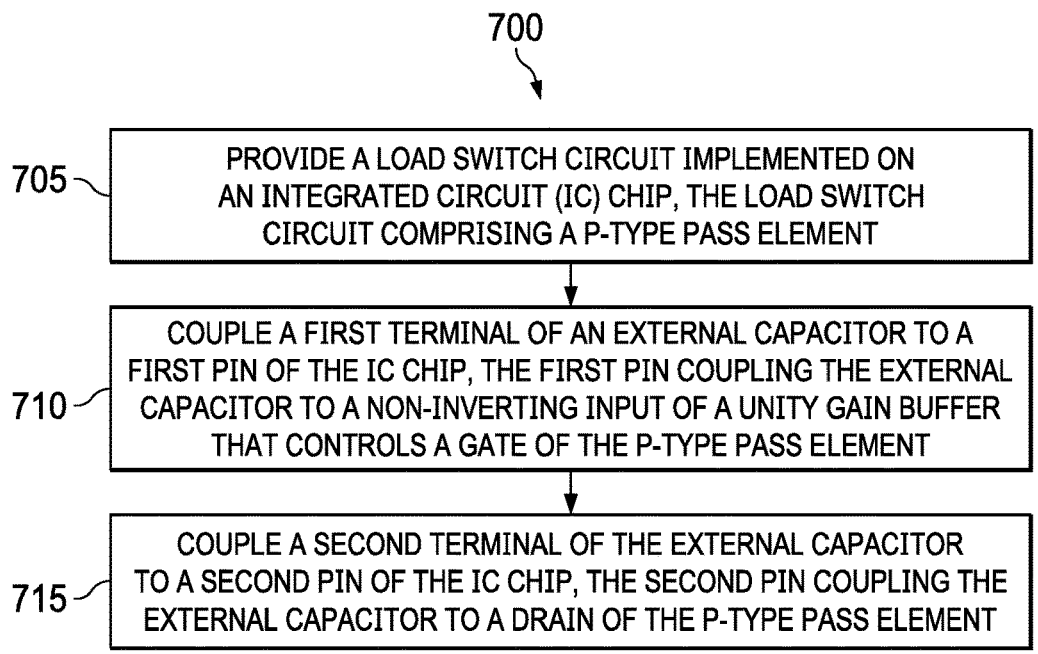
FIG. 7 depicts a method of operating a load switch circuit.

FIG. 7 depicts a method 700 of operating a load switch circuit according to an embodiment of the disclosure. Method 700 begins with providing 705 a load switch circuit implemented on an IC chip where the load switch circuit has a P-type pass element, e.g., first PFET MP1. Method 700 continues with coupling 710 a first terminal of an external capacitor to a first capacitor pin of the IC chip. The first capacitor pin couples the external capacitor to a non-inverting input of a unity gain buffer that controls a gate of the P-type pass element. The method continues with coupling 715 a second terminal of the external capacitor to a second capacitor pin of the IC chip; the second capacitor pin couples the external capacitor to a drain of the P-type pass element, which provides output voltage Vout. In the embodiments of FIG. 1 and FIG. 6, external capacitor Css is coupled to first capacitor pin PN4 and second capacitor pin PN5.

Applicants have disclosed a load switch circuit that includes a power PFET and a driver circuit having a controlled slew rate. The controlled slew rate is provided using the combination of a unity gain buffer that drives the power PFET and a slew-rate capacitor that has a first terminal coupled to the input to the unity gain buffer and a second terminal coupled to the output of the circuit, which is also the drain of the power PFET. The combination of these elements provides a driver having a low quiescent current Iq and an effective and low cost means of implementing slew-rate control in a driver for a high-side P-type switch. Embodiments of the disclosed load switch provide one or more of the following advantages:

The slew rate is better controlled because the soft-start capacitor is placed in feedback instead of coupling a second terminal of the soft-start capacitor to a ground plane. The slew rate is insensitive to load capacitance Cload up to large load values.

The slew-rate capacitor Css in the disclosed circuit can be over ten times smaller than a similar capacitor that is coupled to a ground plane and achieve the same slew rate. Also, the value of Css used to achieve a given slew rate can be reduced by a factor determined by the ratio of the two currents Igate/Iss as compared to the prior art shown in FIG. 8.

The disclosed driver has a naturally low Iq since the slew-rate current Iss and gate current Igate go to low values once the voltage on the SS node and the GATE node are discharged all the way to ground. Additional circuitry to turn off Iq-consuming circuits is not necessary. The value of slew-rate current Iss and gate current can be adjusted to the application depending on the size of the first PFET MP1 and a required minimum slew rate.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A load switch circuit comprising:
   an input voltage node;
   an external load node;
   a first capacitor node adapted to be coupled to a first terminal of an external capacitor;
   a second capacitor node adapted to be coupled to a second terminal of the external capacitor;
   a first P-type field effect transistor (PFET) having a source and a drian coupled between the input voltage node and the external load node and having a gate;
   a driver circuit including a first N-type field effect transistor (NFET) having a drain coupled to the input voltage node, having a source coupled to the gate of the first PFET, and having a gate; and
   a slew-rate-control circuit coupled to the gate of the first NFET, the slew-rate-control circuit including the first capacitor node, which is coupled to the gate of the first NFET, and the second capacitor node, which is coupled to the external load node.

2. The load switch circuit as recited in claim 1 including:
   a ground plane node;
   the slew-rate-control circuit includes:
      a second PFET having a source, a drain, and a gate, the second PFET being coupled in series with a first current sink between the input voltage node and the ground plane node, a node between the drain of the second PFET and the first current sink being coupled to the gate of the first NFET, e the gate of the second PFET being coupled to a power down bar input; and
   the driver circuit includes:
      a third PFET having a source, a drain, and a gate, the third PFET being coupled between the input voltage node and the gate of the first PFET and a second current sink coupled between the gate of the first PFET and the ground plane node, a gate of the third PFET being coupled to the power down bar input.

3. The load switch circuit as recited in claim 2 in which a first current passed by the first current sink is less than a second current passed by the second current sink.

4. The load switch circuit as recited in claim 3 in which a ratio of the first current to the second current is between 1:10 and 1:1,000.

5. The load switch circuit as recited in claim 3 in which a ratio of the first current to the second current is between 1:20 and 1:100.

6. A load switch circuit comprising:
   an input voltage node;
   an external load node;
   a ground plane node;
   a first capacitor node adapted to be coupled to a first terminal of an external capacitor;
   a second capacitor node adapted to be couple to a second terminal of the external capacitor;
   a first P-type field effect transistor (PFET) having a source, a drain, and a gate, the first PFET being coupled between the input voltage node and the external load node;
   a driver circuit including a unity gain buffer having an input voltage terminal coupled to the input voltage node and having a ground terminal coupled to the ground plane node, the unity gain buffer havig an inverting input, a non-inverting input, and an output, the output of the unity gain buffer being coupled to the gate of the first PFET; and a slew-rate-control circuit coupled to the non-inverting input of the unity gain buffer, the slew-rate-control circuit including the first capacitor node, which is coupled to the non-inverting input of the unity gain buffer, and the second capacitor node, which is coupled to the external load node.

7. The load switch circuit as recited in claim 6 in which the slew-rate-control circuit includes a slew-rate-control element coupled between the non-inverting input to the unity gain buffer and the ground plane node.

8. The load switch circuit as recited in claim 6 in which the slew-rate-control circuit includes a disable switch coupled between the input voltage node and the non-inverting input to the unity gain buffer to enable turning the first PFET on and off.

9. The load switch circuit as recited in claim 8 wherein the disable switch includes a second PFET.

10. The load switch circuit as recited in claim 8 the slew-rate-control circuit includes a current sink.

11. The load switch circuit as recited in claim 8 in which the slew-rate-control circuit includes a resistor.

12. A process of operating a load switch circuit having a first P-type field effect transistor (PFET) having a source and a drain coupled between an input voltage node and an external load node and having a gate, the process comprising:
   applying power to the input voltage node and applying a power down signal to a gate of a second PFET and to a gate of a third PFET including:
      charging a start capacitor from the input voltage node through the second PFET,
      charging the gate of the first PFET from the input voltage node through the third PFET, and
      turning off the first PFET; and
   applying a power down bar signal to the gate of the second PFET and to the gate of the third PFET including:
      discharging a first current from the start capacitor to a ground plane node through a first current sink;
      discharging a second current from the gate of the first PFET to the ground plane node through a second current sink; and
      turning on the first PFET.

13. The process of claim 12 including charging a larger current through the second PFET than is discharged by the first current sink, and charging a larger current through the third PFET than is discharged by the second current sink.

14. The process of claim 12 including setting a turn on slew rate of the first PFET in response to the first current discharged by the first current sink.

15. The process of claim 12 in which a ratio between the first current and the second current is from 1:10 and 1:1,000.

16. The process of claim 12 in which a ratio between the first current and the second current is from 1:20 to 1:100.

17. A load switch circuit comprising:
   an input voltage node;
   an external load node;
   a first P-type field effect transistor (PFET) having a source coupled to the input voltage node, having a drain coupled to the external load node and having a gate, the first PFET having a Miller capacitance between the gate and the drain;
   a driver circuit having a first input coupled to the input voltage node, having a second input separate from the first input, and having an output coupled to the gate of the first PFET; and
   a first capacitor node coupled to the second input of the driver circuit and a second capacitor node coupled to the external load node.

18. The load switch of claim 17 including a capacitor having a first terminal coupled to the first capacitor node and a second terminal coupled to the second capacitor node.

* * * * *